(12) United States Patent
Kim et al.

(10) Patent No.: US 9,425,335 B2
(45) Date of Patent: Aug. 23, 2016

(54) OPTICAL DETECTOR

(71) Applicant: Electronics and Telecommunications Research Institute, Daejeon (KR)

(72) Inventors: Jin Tae Kim, Daejeon (KR); Young Jun Yu, Daejeon (KR); Hong Kyw Choi, Daejeon (KR); Choon Gi Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/297,946

(22) Filed: Jun. 6, 2014

(65) Prior Publication Data

US 2015/0194540 A1 Jul. 9, 2015

(30) Foreign Application Priority Data

Jan. 6, 2014 (KR) .................. 10-2014-0001435

(51) Int. Cl.
*H01L 31/028* (2006.01)
*H01L 31/0224* (2006.01)

(52) U.S. Cl.
CPC .......... *H01L 31/028* (2013.01); *H01L 31/0224* (2013.01)

(58) Field of Classification Search
CPC .................... H01L 31/0224; H01L 31/028
See application file for complete search history.

(56) References Cited

U.S. PATENT DOCUMENTS

| 8,053,782 | B2 | 11/2011 | Avouris et al. | |
| 8,461,571 | B2 | 6/2013 | Colli | |
| 2011/0042650 | A1* | 2/2011 | Avouris | H01L 29/1606 257/29 |
| 2012/0049242 | A1* | 3/2012 | Atanackovic | H01L 27/1428 257/184 |
| 2013/0071083 | A1* | 3/2013 | Kim | G02B 6/12 385/131 |
| 2013/0126700 | A1* | 5/2013 | Choi | G01J 1/42 250/200 |
| 2013/0294975 | A1 | 11/2013 | Song et al. | |

FOREIGN PATENT DOCUMENTS

| KR | 10-2013-0031598 A | 3/2013 |
| KR | 10-2013-0077407 A | 7/2013 |
| KR | 10-2013-0119767 A | 11/2013 |

OTHER PUBLICATIONS

Fengnian Xia et al., "Ultrafast graphene photodetector", Nature Nanotechnology, vol. 4, pp. 839-843, Oct. 11, 2009.
Thomas Mueller et al., "Graphene photodetectors for highspeed optical communications", Nature Photonics, vol. 4, pp. 297-301, Mar. 28, 2010.
Jin Tae Kim et al., "Graphene-based plasmonic photodetector for photonic integrated circuits", Optics Express, vol. 22, Issue 1, pp. 803-808, Jan. 7, 2014.

* cited by examiner

*Primary Examiner* — Evan Pert
*Assistant Examiner* — Leslie Pilar Cruz
(74) *Attorney, Agent, or Firm* — Rabin & Berdo, P.C.

(57) ABSTRACT

Disclosed is an optical detector. The optical detector includes: a first dielectric layer; a graphene optical transmission line formed on the first dielectric layer; a graphene optical detector formed on the first dielectric layer and configured to detect light transmitted along the graphene optical transmission line; electric wires formed on the graphene optical detector; metal pads positioned at both ends of the graphene optical detector and connected with the electric wires; and a second dielectric layer formed on the graphene optical transmission line, in which the graphene optical detector detects an intensity of light incident in a horizontal direction with respect to a surface of the graphene optical transmission line.

20 Claims, 6 Drawing Sheets

OPTICAL DETECTOR

CROSS-REFERENCE TO RELATED APPLICATIONS

This application is based on and claims priority from Korean Patent Application No. 10-2014-0001435, filed on Jan. 6, 2014, with the Korean Intellectual Property Office, the disclosure of which is incorporated herein in its entirety by reference.

BACKGROUND

1. Field

The present invention relates to an optical detector, and more particularly, to an optical detector based on a graphene optical transmission line.

2. Discussion of Related Art

An optical detector is a device of detecting an intensity of light and generating an electric signal. The optical detector may be implemented by using graphene having a high optical absorption rate. As described above, there are various types of optical detectors using graphene.

However, the optical detectors implemented by using graphene have a problem in that light needs to be incident only in a direction vertical to a surface of the graphene in order to detect an intensity of light. Further, there is a problem in that some of the optical detectors implemented using the graphene need to additionally include an optical waveguide structure requiring high costs.

SUMMARY

The present invention has been made in an effort to provide an optical detector capable of detecting an intensity of light by using light incident in a horizontal direction based on a surface of a graphene optical transmission line.

Further, the present invention has been made in an effort to provide an optical detector requiring no additional optical waveguide structure.

An embodiment of the present invention provides an optical detector, including: a first dielectric layer; a graphene optical transmission line formed on the first dielectric layer; a graphene optical detector formed on the first dielectric layer and configured to detect light transmitted along the graphene optical transmission line; electric wires formed on the graphene optical detector; metal pads positioned at both ends of the graphene optical detector and connected with the electric wires; and a second dielectric layer formed on the graphene optical transmission line, in which the graphene optical detector detects an intensity of light incident in a horizontal direction with respect to a surface of the graphene optical transmission line.

In the present exemplary embodiment, the metal pads may include: a first metal pad to which a plus electrode is applied, the first metal pad being positioned in one side surface based on the graphene optical detector; and a second metal pad to which a minus electrode is applied, the second metal pad being positioned in the other side surface based on the graphene optical detector.

In the present exemplary embodiment, the optical detector may further include a bias unit connected with the first metal pad and the graphene optical transmission line to apply a gate bias voltage.

In the present exemplary embodiment, the electric wires may include: first electric wires positioned in a vertical direction based on the graphene optical transmission line and connected to the first metal pad; and second electric wires positioned in a vertical direction based on the graphene optical transmission line and connected to the second metal pad.

In the present exemplary embodiment, the first electric wires and the second electric wires may have an interdigitated electrode structure based on a predetermined interval therebetween.

In the present exemplary embodiment, the electric wires may include: a first reference electric wire positioned in a vertical direction based on the graphene optical transmission line and connected to the first metal pad; a second reference electric wire positioned in the vertical direction based on the graphene optical transmission line and connected to the second metal pad; first electric wires connected to the first reference electric wire and positioned in a horizontal direction based on the graphene optical transmission line; and second electric wires connected to the second reference electric wire and positioned in the horizontal direction based on the graphene optical transmission line.

In the present exemplary embodiment, the first electric wires and the second electric wires may have an interdigitated electrode structure based on a predetermined interval therebetween.

In the present exemplary embodiment, the first metal pad and the electric wires connected to the first metal pad, and the second metal pad and the electric wires connected to the second metal pad may be formed of different single metals or different combination structures of the single metals.

In the present exemplary embodiment, a combination form of the different single metals may include a combination form having a metal alloy or a metal lamination structure.

In the present exemplary embodiment, the single metal may include one of chrome (Cr), titanium (Ti), lead (Pd), and gold (Au).

In the present exemplary embodiment, the graphene optical transmission line and the graphene optical detector may be simultaneously manufactured in the same graphene film.

In the present exemplary embodiment, the graphene optical detector may be spaced apart from the graphene optical transmission line by a predetermined interval, cross the graphene optical transmission line in a cross (+) shape, and connect the metal pads.

In the present exemplary embodiment, the optical detector may further include an intermediate dielectric layer positioned between the graphene optical detector and the graphene optical transmission line.

Another embodiment of the present invention provides an optical detector, including: a first dielectric layer; a graphene optical transmission line formed on the first dielectric layer; a graphene optical detector formed on the first dielectric layer and configured to detect light transmitted along the graphene optical transmission line; metal pads positioned at both ends of the graphene optical detector and connected through the graphene optical detector; and a second dielectric layer formed on the graphene optical transmission line, in which the graphene optical detector detects an intensity of light incident in a horizontal direction with respect to a surface of the graphene optical transmission line.

In the present exemplary embodiment, the metal pads may include: a first metal pad to which a plus electrode is applied, the first metal pad being positioned in one side surface based on the graphene optical detector; and a second metal pad to which a minus electrode is applied, the second metal pad being positioned in the other side surface based on the graphene optical detector.

In the present exemplary embodiment, the first metal pad and the second metal pad may be formed of different single metals or different combination structures of the single metals.

In the present exemplary embodiment, a combination form of the different single metals may include a combination form having a metal alloy or a metal lamination structure.

In the present exemplary embodiment, the single metal may include one of chrome (Cr), titanium (Ti), lead (Pd), and gold (Au).

In the present exemplary embodiment, a ratio obtained by dividing a distance between a center line of the graphene optical transmission line and one of the metal pads by a distance between the metal pads may have a value between about 0.05 to about 0.4.

In the present exemplary embodiment, the graphene optical transmission line and the graphene optical detector may have a cross (+) shape.

According to the exemplary embodiments of the present invention, the optical detector detects an intensity of light by using a graphene optical transmission line, thereby detecting an intensity of light by using light incident in a horizontal direction with respect to a surface of graphene. Further, the optical detector uses the graphene optical transmission line, thereby being implemented without an additional optical waveguide structure.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

The present invention provides an optical detector capable of measuring an intensity of light incident in a direction horizontal to a surface of a graphene optical transmission line based on the graphene optical transmission line.

Figure 1:
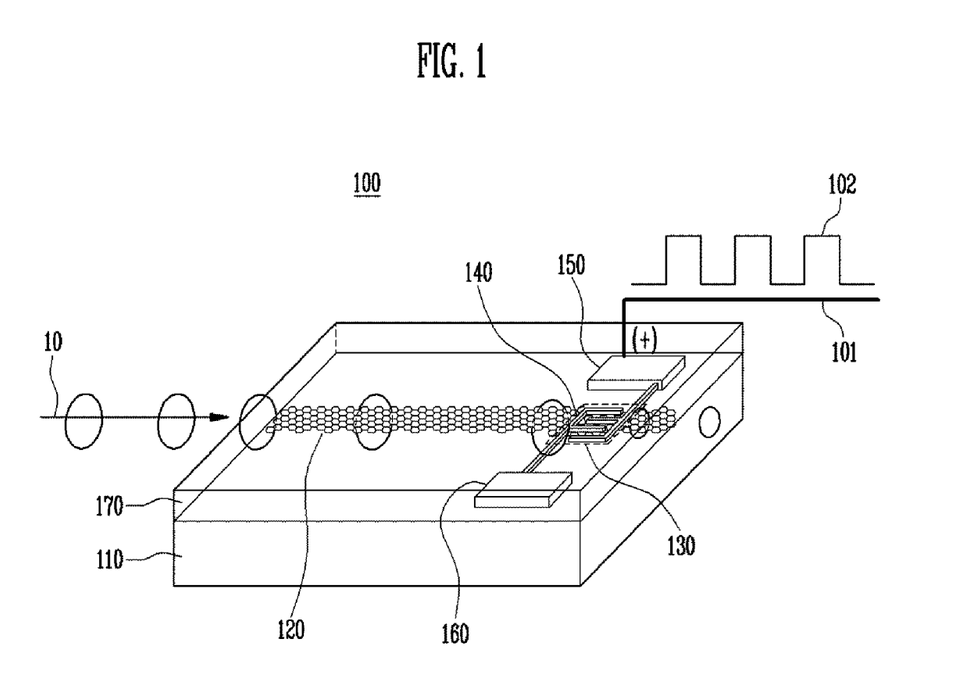
FIG. 1 is a diagram illustrating an optical detector according to an exemplary embodiment of the present invention.

FIG. 1 is a diagram illustrating a structure of an optical detector according to an exemplary embodiment of the present invention.

Referring to FIG. 1, an optical detector 100 includes a first dielectric layer 110, a graphene optical transmission line 120, a graphene optical detector 130, electric wires 140, metal pads 150 and 160, and a second dielectric layer 170.

The first dielectric layer 110 may be formed of polymer, glass, quartz, silicon, and the like.

The graphene optical transmission line 120 represents a thin layer formed of graphene, and is formed in a longitudinal direction on the first dielectric layer 110. For example, the graphene is a material in which carbon atoms are connected each other to form a thin plane structure, and has an electrical characteristic. The carbon atoms are connected each other to form one carbon atom layer, and the graphene may be formed of a single or multilayered carbon atom layer.

Here, the graphene optical transmission line 120 may be formed of a single graphene layer, and has the same thickness as that of one carbon atom. The carbon atom has 6 rings (pyranose) as a basic unit, and may also be formed of 5 rings (furanose) or 7 rings (tropolone).

The graphene optical detector 130 may be simultaneously manufactured with the graphene optical transmission line 120 to be integrally implemented with the graphene optical transmission line 120 on the same graphene film. The graphene optical detector 130 represents a part forming a contact point with the electric wires 140.

The electric wires 140 may be located on the graphene optical detector 130, and may be connected to one of the first metal pad 150 and the second metal pad 160.

The metal pads 150 and 160 are located in directions of both ends of the graphene optical detector 130. Further, the metal pads 150 and 160 are positioned at both side surfaces in a longitudinal direction of the graphene optical transmission line 120.

The electric wires 140 are connected to the metal pads 150 and 160.

The metal pads 150 and 160 and the electric wires 140 may be formed of a single metal corresponding to one of chrome (Cr), titanium (Ti), lead (Pb), and gold (Au), or may be formed of a combination structure in which single metals are combined with each other, for example, a metal alloy or a metal lamination.

In this case, all of the metal pads 150 and 160 and the electric wires 140 may be formed of the same metal component. That is, the metals of the metal pads 150 and 160 and the electric wires 140 may be the same, or the combination structures (the metal alloys or the metal lamination) of the metals may be the same. For example, all of the metal pads 150 and 160 and the electric wires 140 may be formed of chrome (Cr). Further, the metal pads 150 and 160 and the electric wires 140 may be formed of a combination structure of chrome (Cr) and titanium (Ti).

Contrary to this, at least a part of the metal pads 150 and 160 and the electric wires 140 may be formed of different metal components. That is, the metals of the metal pads 150 and 160 and the electric wires 140 may be different from each other, or the combination structures (the metal alloys or the metal lamination) of the metals may be different from each other. For example, the first metal pad 150 and the electric wires 140 connected to the first metal pad 150 may be formed of gold (Au), and the second metal pad 160 and the electric wires 140 connected to the second metal pad 160 may be formed of lead (Pb). Further, the first metal pad 150 and the electric wires 140 connected to the first metal pad 150 may be formed of a combination structure of gold (Au) and titanium (Ti), and the second metal pad 160 and the electric wires 140 connected to the second metal pad 160 may be formed of a combination structure of lead (Pb) and gold (Au).

As described above, when the metal pads 150 and 160 and the electric wires 140 have the different single metals or the combination structures of the different metals, an optical current may be generated without application of an external voltage.

Further, the first metal pad 150 is positioned in one side surface based on the graphene optical detector 130, and a plus (+) electrode may be applied thereto.

Further, the second metal pad 160 is positioned in a side surface different from that of the first metal pad 150 based on the graphene optical detector 130, and a minus (−) electrode may be applied thereto.

The second dielectric layer 170 may be positioned on the graphene optical transmission line 120, and may be formed of polymer, glass, quartz, silicon and the like, similar to the first dielectric layer 110.

Here, the incident light is incident in a horizontal direction 10 with respect to a surface of the graphene optical transmission line 120.

In this case, light wave-guided along the graphene optical transmission line 120 generates a pair of electron and hole between the graphene optical detector 130 and the electric wires 140. Here, the pair of electron and hole moves by a voltage applied to the metal pads 150 and 160, and generates an optical current 102. For example, the optical current 102 is an intensity of incident light output through a conducting wire 101 connected with the first metal pad 150 to which the plus (+) electrode is applied. If a size of a region of the contact point between the graphene optical detector 130 and the electric wires 140 is increased, a size of the optical current is increased.

As described above, the optical detector 100 suggested in the present invention may measure an intensity of light incident in the horizontal direction 10, not the vertical direction, with respect to the surface of the graphene optical transmission line 120.

Figure 2A:
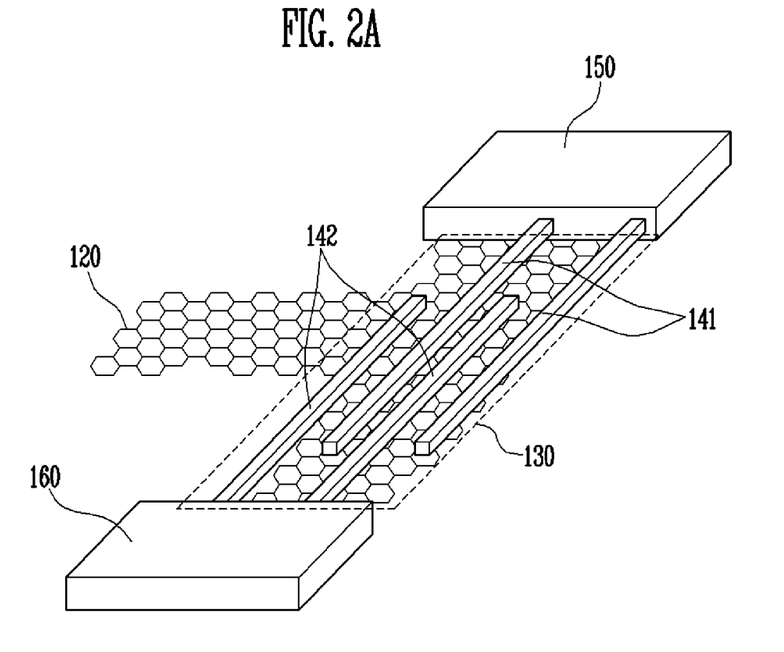
FIG. 2A is a diagram illustrating electric wires located in a direction vertical to a graphene optical transmission line according to the exemplary embodiment of the present invention.

FIG. 2A is a diagram illustrating electrical wires located in a direction vertical to the graphene optical transmission line according to the exemplary embodiment of the present invention.

Referring to FIG. 2A, electric wires 141 and 142 are arranged in a vertical direction based on the longitudinal direction of the graphene optical transmission line 120 (or a direction 10 in which light is incident). The electric wires 141 and 142 may be formed of a metal.

The first electric wires 141 are connected with the first metal pad 150, and are arranged in a vertical direction based on the graphene optical transmission line 120.

The second electric wires 142 are connected with the second metal pad 160, and are arranged in the vertical direction based on the graphene optical transmission line 120.

The first electric wires 141 and the second electric wires 142 may be positioned on the graphene optical detector 130, and may form contact point regions with the graphene optical detector 130.

Further, the first electric wires 141 and the second electric wires 142 have an interdigitated electrode structure.

Figure 2B:
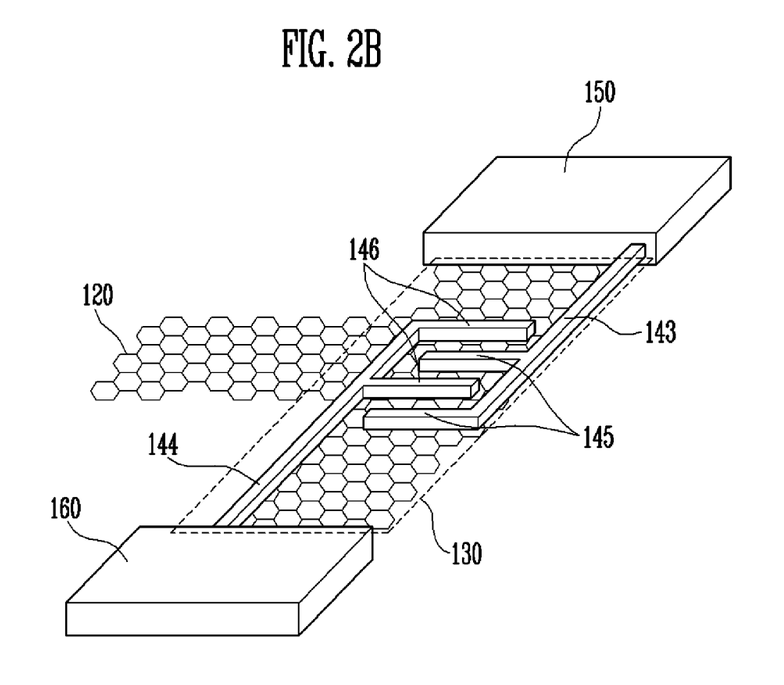
FIG. 2B is a diagram illustrating electric wires located in a direction parallel to the graphene optical transmission line according to the exemplary embodiment of the present invention.

FIG. 2B is a diagram illustrating electrical wires located in a direction parallel to the graphene optical transmission line according to the exemplary embodiment of the present invention.

Electric wires 145 and 146 are arranged in a horizontal direction based on the longitudinal direction of the graphene optical transmission line 120 (or the direction 10 in which light is incident). To this end, the optical detector includes reference electric wires 143 and 144 for connection of the electric wires 145 and 146 of the optical detector 100. Here, the electric wires 143, 144, 145, and 146 may be formed of a metal.

The first reference electric wire 143 is connected to the first metal pad 150, and the second reference electric wire 144 is connected to the second metal pad 160.

The third electric wires 145 are connected with the first reference electric wire 143, and are arranged in the horizontal direction based on the graphene optical transmission line 120.

The fourth electric wires 146 are connected with the second reference electric wire 144, and are arranged in the horizontal direction based on the graphene optical transmission line 120.

Further, the third electric wires 145 and the fourth electric wires 146 have an interdigitated electrode structure.

FIGS. 2A and 2B exemplarily describe the form of the electric wires 140, and the electric wires may have various forms in addition to the aforementioned form.

In the meantime, the graphene optical detector 130 may be implemented by a part of the graphene optical transmission line 120 as illustrated in FIG. 1, and may be implemented in a form connecting the first metal pad 150 and the second metal pad 160 as illustrated in FIGS. 2A and 2B.

Figure 3A:
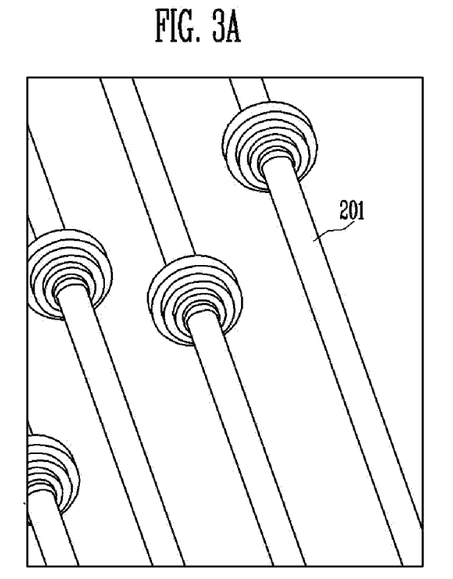
FIGS. 3A and 3B are diagrams illustrating an optical waveguide principle of the graphene optical transmission line according to the exemplary embodiment of the present invention.
Figure 3B:
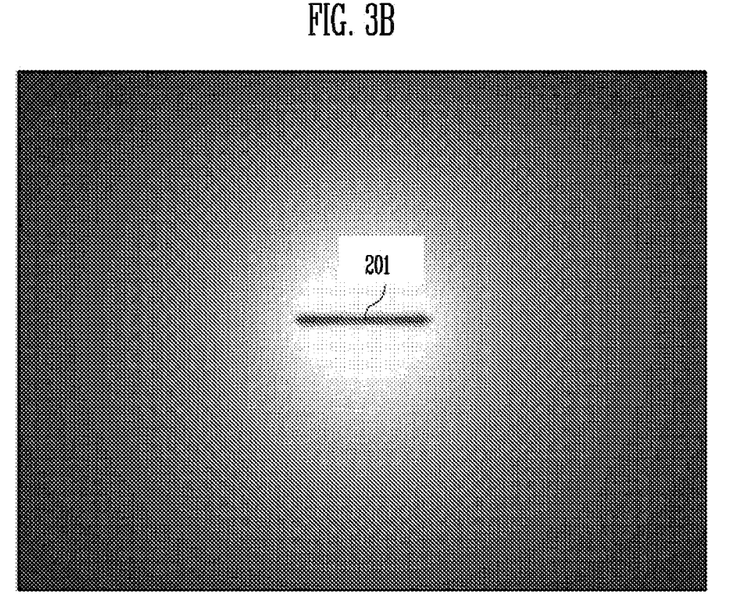

FIGS. 3A and 3B are diagrams illustrating an optical waveguide principle of the graphene optical transmission line according to the exemplary embodiment of the present invention.

FIGS. 3A and 3B illustrate a flow and a guide mode of an optical signal transmitted through the graphene optical transmission line 120. A free electron polarization 201 is positioned within a graphene strip forming the graphene optical transmission line 120. The graphene strip includes a plurality of free electron polarizations 201. In this case, an optical waveguide principle of the graphene optical transmission line 120 will be described. An optical signal is transmitted through mutual coupling between the free electron polarizations. The continuous coupling of the free electrons is referred to as surface plasmon polarition. Long-distance optical transmission in the surface plasmon polarition is referred to as a long-range surface plasmon polarition.

A Surface Plasmon (SP) may be an oscillation wave of a charge density in which a real number term of a dielectric constant is bound to and progress along boundary interfaces having opposite signs. The surface charge density oscillation may form a longitudinal surface bound wave. The longitudinal surface bound wave is a component in which an electric field component of incident light is vertical to the interface, and only a Transverse Magnetic (TM) mode may excite and waveguide the long-range surface plasmon polarition. For example, the graphene optical transmission line 120 may have a thickness of about 1 nm to 200 nm and a width of 2 μm to 100 μm.

Figure 4:
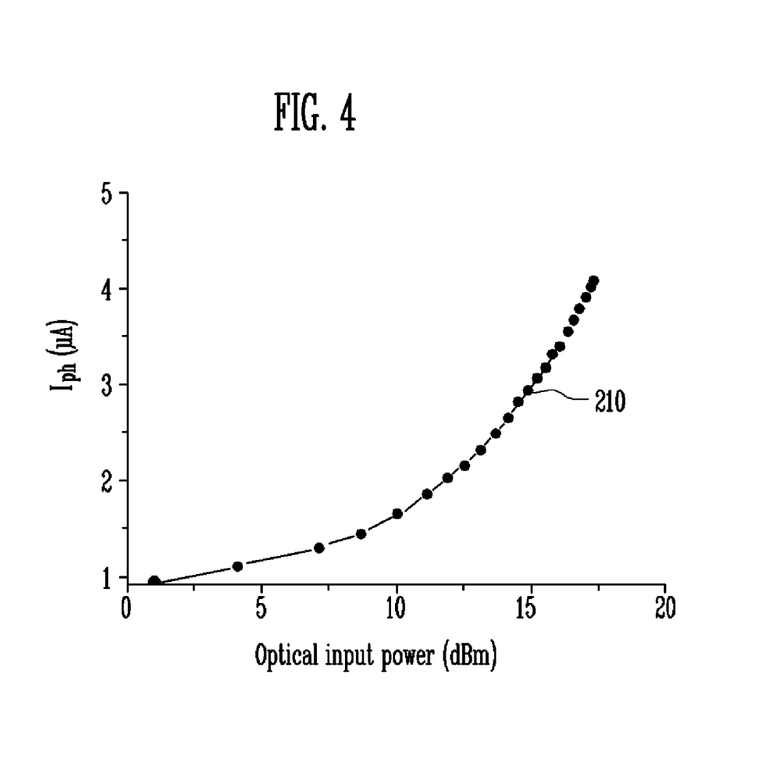
FIG. 4 is a graph illustrating an optical detection characteristic according to an intensity of an optical signal of a graphene optical detector according to the exemplary embodiment of the present invention.

FIG. 4 is a graph illustrating an optical detection characteristic according to an intensity of an optical signal of the graphene optical detector according to the exemplary embodiment of the present invention.

Referring to FIG. 4, a horizontal axis of the graph is an optical input power (dBm), and a vertical axis of the graph is an optical current (μA) output from the optical detector. An optical current change 210 according to the input optical input power is illustrated in the graph.

Figure 5:
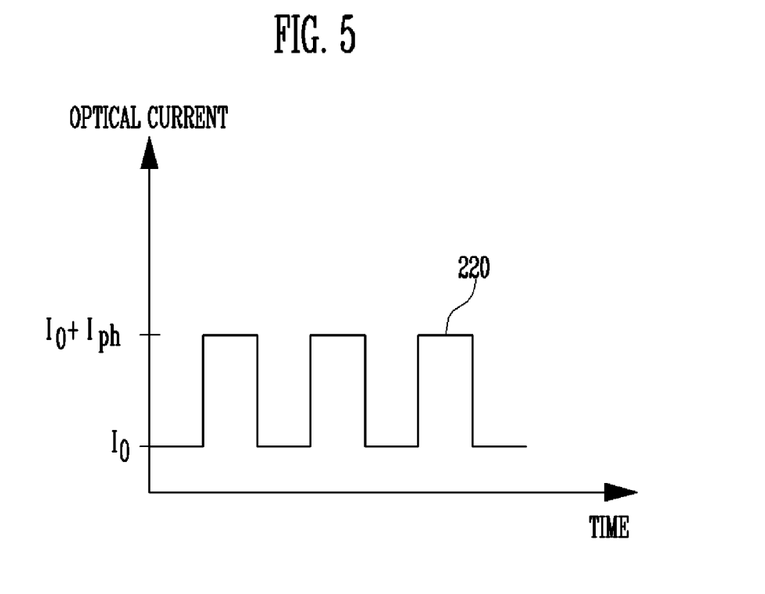
FIG. 5 is a graph illustrating an optical detection characteristic according to a temporal change in an intensity of an optical signal of the optical detector according to the exemplary embodiment of the present invention.

FIG. 5 is a graph illustrating an optical detection characteristic according to a temporal change in an intensity of an optical signal of the optical detector according to the exemplary embodiment of the present invention.

Referring to FIG. 5, a horizontal axis of the graph indicates time, and a vertical axis of the graph indicates an optical current. In this case, when a voltage is applied to the first metal pad 150 and the second metal pad 160 formed at both ends of the graphene optical detector 130 integrally formed with the graphene optical transmission line 120, a current Io flows. In this case, a plus (+) electrode is applied to the first metal pad 150, and a minus (−) electrode is applied to the second metal pad 160. As illustrated in FIG. 1, when an optical signal is applied to one side surface of the graphene optical transmission line 120, the optical signal is transmitted along the graphene optical transmission line 120 and arrives the graphene optical detector 130.

The pair of electron and hole is generated inside the graphene optical detector 130 receiving the optical signal, and an optical current Ip is generated through the generated pair of electron and hole. As a result, a current I flowing between the first metal pad 150 and the second metal pad 160 is "Io+Ip".

Accordingly, when the intensity of the light incident to the graphene optical detector 130 is temporarily changed, a change in the optical current I may be exhibited as reference number 220 in the graph.

As described above, at least a part of the metal pads 150 and 160 and the electric wires 140 may be formed of different metal components. That is, the metals of the metal pads 150 and 160 and the electric wires 140 may be different from each other, or the combination structures (the metal alloys or the metal lamination) of the metals may be different from each other.

For example, the first metal pad 150 and the electric wires 140 connected to the first metal pad 150 may be formed of gold (Au) (or a combination form of titanium (Ti) and gold (Au)), and the second metal pad 160 and the electric wires 140 connected to the second metal pad 160 may be formed of lead (Pb) (or a combination form of lead (Pb) and gold (Au)). In this case, Io may be 0.

In the meantime, the optical signal passing through the graphene optical detector 130 may further proceed along the graphene optical transmission line 120.

Accordingly, it is possible to provide the optical detector 10 in which the graphene optical transmission line 120 for the optical signal transmission is integrated with the graphene optical detector 130 for the optical signal detection.

Figure 6:
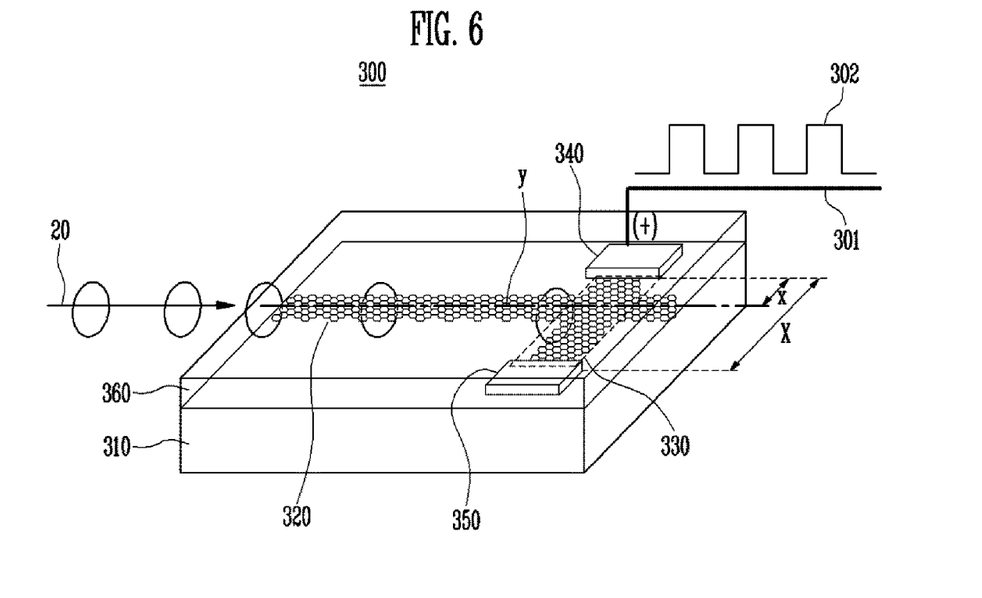
FIG. 6 is a diagram illustrating an optical detector according to another exemplary embodiment of the present invention.

FIG. 6 is a diagram illustrating an optical detector according to another exemplary embodiment of the present invention.

Referring to FIG. 6, an optical detector 300 includes a first dielectric layer 310, a graphene optical transmission line 320, a graphene optical detector 330, metal pads 340 and 350, and a second dielectric layer 360. Here, the incident light is incident in a horizontal direction 20 with respect to a surface of the graphene optical transmission line 320.

The optical detector 300 of FIG. 6 has a structure in which the electric wires 140 are not included in the optical detector 100 illustrated in FIG. 1. Further, the graphene optical transmission line 320 and the graphene optical detector 330 are formed in a cross shape.

Except for the difference, the optical detector 300 of FIG. 6 generally has a similar structure to that of the optical detector 100 of FIG. 1. Accordingly, detailed descriptions of the constituent elements of the optical detector 300 will refer to the descriptions given with reference to FIG. 1.

In this case, a ratio of distance X between the metal pads 340 and 350 positioned at both ends of the graphene optical detector 330 to distance x between a center line y of the graphene optical transmission line 320 and the metal pad 340 or 350 is important. The ratio (x/X) obtained by dividing the distance x between the center line y of the graphene optical transmission line 320 and the first metal pad 340 (or the second metal pad 350) by distance X between the metal pads 340 and 350 needs to have a value of about 0.05 to 0.04 (equal to or larger than about 0.05 and equal to or smaller than about 0.4).

Here, the plus (+) electrode is applied to the first metal pad 340, and the minus (−) electrode is applied to the second metal pad 350. In this case, an optical current 302 is an intensity of incident light output through a conducting wire 301 connected with the first metal pad 340 to which the plus (+) electrode is applied.

In the meantime, the metal pads 150 and 160 may be formed of a single metal corresponding to one of chrome (Cr), titanium (Ti), lead (Pb), and gold (Au), or may be formed of a combination structure in which single metals are combined with each other, for example, a metal alloy or a metal lamination.

In this case, all of the metal pads 150 and 160 may be formed of the same metal component. That is, the metals of the metal pads 150 and 160 may be the same, or the combination structures (the metal alloys or the metal lamination) of the metals may be the same.

Contrary to this, the metal pads 150 and 160 may be formed of different metal components. That is, the metals of the first metal pad 150 and the second metal pad 160 may be different from each other, or the combination structures (the metal alloys or the metal lamination) of the metals may be different from each other. Here, when the first metal pad 150 and the second metal pad 160 have the different single metals or the combination structures of the different metals, an optical current may be generated without application of an external voltage.

Figure 7A:
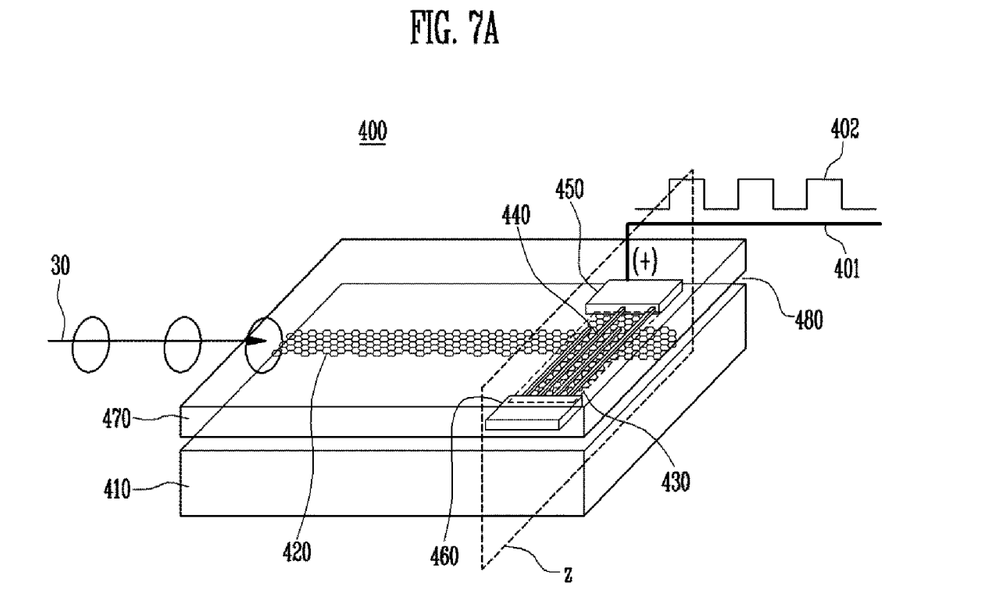
FIG. 7A is a diagram illustrating an optical detector according to another exemplary embodiment of the present invention.

FIG. 7A is a diagram illustrating an optical detector according to another exemplary embodiment of the present invention.

Referring to FIG. 7A, an optical detector 400 includes a first dielectric layer 410, a graphene optical transmission line 420, a graphene optical detector 430, electric wires 440, metal pads 450 and 460, a second dielectric layer 470, and an intermediate dielectric layer 480. Here, incident light is incident in a horizontal direction 30 with respect to a surface of the graphene optical transmission line 420.

The optical detector 400 of FIG. 7A additionally includes the intermediate dielectric layer 480 between the first dielectric layer 410 and the second dielectric layer 470 compared to the optical detector illustrated in FIG. 1. Further, the graphene optical transmission line 420 and the graphene optical detector 430 are separately implemented based on the intermediate dielectric layer 480, and the graphene optical transmission line 420 and the graphene optical detector 430 are implemented in a cross form.

Except for the difference, the optical detector 400 of FIG. 7A generally has a similar structure to that of the optical detector 100 of FIG. 1. Accordingly, detailed descriptions of the constituent elements of the optical detector 400 will refer to the descriptions given with reference to FIG. 1.

Here, the intermediate dielectric layer 480 may be formed of ionized gel capable of independently supplying ions.

Here, the plus (+) electrode is applied to the first metal pad 450, and the minus (−) electrode is applied to the second metal pad 460. In this case, an optical current 402 is an intensity of incident light output through a conducting wire 401 connected with the first metal pad 450 to which the plus (+) electrode is applied.

Figure 7B:
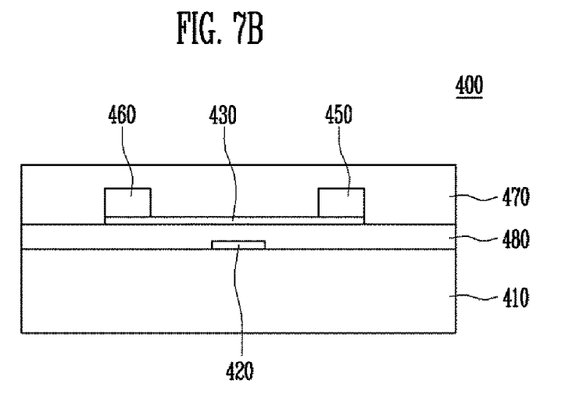
FIG. 7B is a diagram exemplarily illustrating a cross-section of the optical detector of FIG. 7A.

FIG. 7B is a diagram exemplarily illustrating a cross-section of the optical detector of FIG. 7A.

FIG. 7B illustrates a cross-section of the optical detector 400 based on plane z illustrated in FIG. 7A. The first dielectric layer 410 is positioned at a lower end of the optical detector 400.

The graphene optical transmission line 420 is positioned at an upper end of the first dielectric layer 410, and the intermediate dielectric layer 480 is positioned on the graphene optical transmission line 420.

The graphene optical detector 430 is positioned at the upper end of the intermediate dielectric layer 480, and the first metal pad 450 and the second metal pad 460 are positioned at both ends of the graphene optical detector 430.

Further, the second dielectric layer 470 is positioned at upper ends of the intermediate dielectric layer 480, the graphene optical detector 430, and the metal pads 450 and 460.

Figure 8:
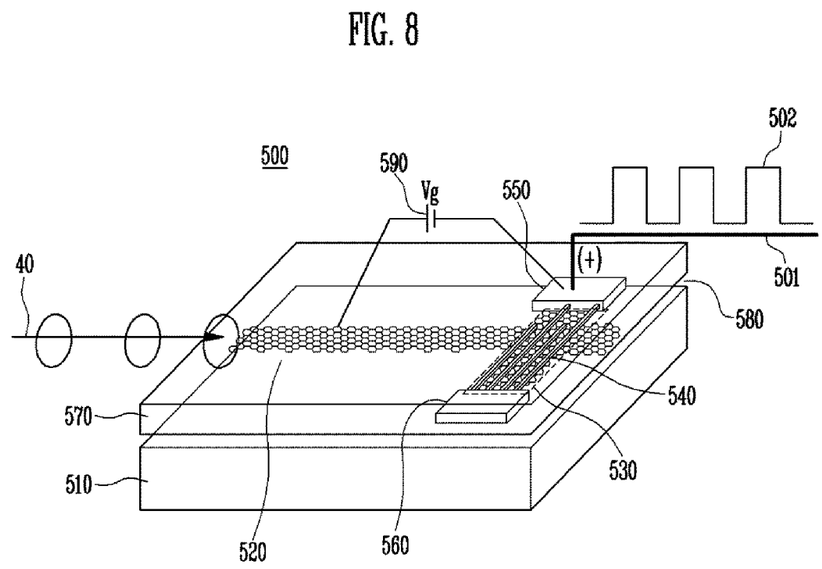
FIG. 8 is a diagram illustrating application of a gate bias to the optical detector according to another exemplary embodiment of the present invention.

FIG. 8 is a diagram exemplarily illustrating application of a gate bias to the optical detector according to another exemplary embodiment of the present invention.

Referring to FIG. 8, an optical detector 500 includes a first dielectric layer 510, a graphene optical transmission line 520, a graphene optical detector 530, electric wires 540, metal pads 550 and 560, a second dielectric layer 570, an intermediate dielectric layer 580, and a bias unit 590. Here, incident light is incident in a horizontal direction 40 with respect to a surface of the graphene optical transmission line 520.

The optical detector 500 of FIG. 8 additionally includes the bias unit 590 compared to the optical detector 400 illustrated in FIGS. 7A and 7B.

Except for the difference, the optical detector 500 of FIG. 8 generally has a similar structure to that of the optical detector 400 of FIGS. 7A and 7B. Accordingly, detailed descriptions of the constituent elements of the optical detector 500 will refer to the descriptions given with reference to FIGS. 7A and 7B.

The bias unit 590 applies a bias voltage Vg between the graphene optical transmission line 520 and the first metal pad 550. Accordingly, the bias unit 590 may increase a magnitude of the optical current generated by the optical detector 500. That is, as a carrier density of the optical detector 500 is increased by the gate bias voltage Vg, a magnitude of the generated optical current is also increased.

Here, the plus (+) electrode is applied to the first metal pad 550, and the minus (−) electrode is applied to the second metal pad 560. In this case, an optical current 502 is an intensity of incident light output through a conducting wire 501 connected with the first metal pad 550 to which the plus (+) electrode is applied.

Accordingly, the optical detector suggested in the present invention may detect an intensity of an optical signal even though light is incident in the horizontal direction with respect to the surface of the graphene optical transmission line. Further, the optical detector suggested in the present invention does not additionally require an optical waveguide structure with high costs and the like.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. An optical detector, comprising:
   a first dielectric layer;
   a graphene optical transmission line formed on the first dielectric layer;
   a graphene optical detector formed on the first dielectric layer and configured to detect light transmitted along the graphene optical transmission line;
   electric wires formed on the graphene optical detector;
   metal pads positioned at both ends of the graphene optical detector and connected with the electric wires; and
   a second dielectric layer formed on the graphene optical transmission line,
   wherein the graphene optical detector detects an intensity of light incident in a horizontal direction with respect to a surface of the graphene optical transmission line, and
   wherein the graphene optical transmission line is spaced apart from the metal pads.

2. The optical detector of claim 1, wherein the metal pads include:
   a first metal pad to which a plus electrode is applied, the first metal pad being positioned in one side surface based on the graphene optical detector; and
   a second metal pad to which a minus electrode is applied, the second metal pad being positioned in the other side surface based on the graphene optical detector.

3. The optical detector of claim 2, wherein the optical detector further includes a bias unit connected with the first metal pad and the graphene optical transmission line to apply a gate bias voltage.

4. The optical detector of claim 2, wherein the electric wires include:
   first electric wires positioned in a vertical direction based on the graphene optical transmission line and connected to the first metal pad; and second electric wires positioned in a vertical direction based on the graphene optical transmission line and connected to the second metal pad.

5. The optical detector of claim 4, wherein the first electric wires and the second electric wires have an interdigitated electrode structure based on a predetermined interval therebetween.

6. The optical detector of claim 2, wherein the electric wires include:
- a first reference electric wire positioned in a vertical direction based on the graphene optical transmission line and connected to the first metal pad;
- a second reference electric wire positioned in the vertical direction based on the graphene optical transmission line and connected to the second metal pad;
- first electric wires connected to the first reference electric wire and positioned in a horizontal direction based on the graphene optical transmission line; and
- second electric wires connected to the second reference electric wire and positioned in the horizontal direction based on the graphene optical transmission line.

7. The optical detector of claim 6, wherein the first electric wires and the second electric wires have an interdigitated electrode structure based on a predetermined interval therebetween.

8. The optical detector of claim 2, wherein the first metal pad and the electric wires connected to the first metal pad, and the second metal pad and the electric wires connected to the second metal pad are formed of different single metals or different combination structures of the single metals.

9. The optical detector of claim 8, wherein a combination form of the different single metals includes a combination form having a metal alloy or a metal lamination structure.

10. The optical detector of claim 8, wherein the single metal includes one of chrome (Cr), titanium (Ti), lead (Pd), and gold (Au).

11. The optical detector of claim 1, wherein the graphene optical transmission line and the graphene optical detector are simultaneously manufactured in the same graphene film.

12. The optical detector of claim 1, wherein the graphene optical detector is spaced apart from the graphene optical transmission line by a predetermined interval, crosses the graphene optical transmission line in a cross (+) shape, and connects the metal pads.

13. The optical detector of claim 12, further comprising:
an intermediate dielectric layer positioned between the graphene optical detector and the graphene optical transmission line.

14. An optical detector, comprising:
- a first dielectric layer;
- a graphene optical transmission line formed on the first dielectric layer;
- a graphene optical detector formed on the first dielectric layer and configured to detect light transmitted along the graphene optical transmission line;
- metal pads positioned at both ends of the graphene optical detector and connected through the graphene optical detector; and
- a second dielectric layer formed on the graphene optical transmission line,
- wherein the graphene optical detector detects an intensity of light incident in a horizontal direction with respect to a surface of the graphene optical transmission line, and
- wherein the graphene optical transmission line is spaced apart from the metal pads.

15. The optical detector of claim 14, wherein the metal pads include:
- a first metal pad to which a plus electrode is applied, the first metal pad being positioned in one side surface based on the graphene optical detector; and
- a second metal pad to which a minus electrode is applied, the second metal pad being positioned in the other side surface based on the graphene optical detector.

16. The optical detector of claim 15, wherein the first metal pad and the second metal pad are formed of different single metals or different combination structures of the single metals.

17. The optical detector of claim 16, wherein a combination form of the different metals includes a combination form having a metal alloy or a metal lamination structure.

18. The optical detector of claim 16, wherein the single metal includes one of chrome (Cr), titanium (Ti), lead (Pd), and gold (Au).

19. The optical detector of claim 14, wherein a ratio obtained by dividing a distance between a center line of the graphene optical transmission line and one of the metal pads by a distance between the metal pads has a value between about 0.05 to about 0.4.

20. The optical detector of claim 14, wherein the graphene optical transmission line and the graphene optical detector have a cross (+) shape.

* * * * *